United States Patent
Balasubramanian

(10) Patent No.: US 7,015,727 B2
(45) Date of Patent: Mar. 21, 2006

(54) GENERATING A LOCK SIGNAL INDICATING WHETHER AN OUTPUT CLOCK SIGNAL GENERATED BY A PLL IS IN LOCK WITH AN INPUT REFERENCE SIGNAL

(75) Inventor: Suresh Balasubramanian, Coimbatore (IN)

(73) Assignee: Texas Instruments Incorporated, Dallas, TX (US)

( * ) Notice: Subject to any disclaimer, the term of this patent is extended or adjusted under 35 U.S.C. 154(b) by 863 days.

(21) Appl. No.: 10/015,741

(22) Filed: Dec. 17, 2001

(65) Prior Publication Data
US 2003/0112913 A1 Jun. 19, 2003

(51) Int. Cl.
G01R 23/02 (2006.01)

(52) U.S. Cl. .......................... 327/49; 327/43
(58) Field of Classification Search ................ 327/2–3, 327/9, 12, 24, 147, 156, 163, 39, 40, 43, 327/47, 49
See application file for complete search history.

(56) References Cited

U.S. PATENT DOCUMENTS 3,936,758 A * 2/1976 Kostelnicek et al. ........... 327/3
5,008,635 A 4/1991 Hanke et al.
5,347,232 A 9/1994 Nishimichi
5,886,582 A 3/1999 Stansell
6,346,861 B1 * 2/2002 Kim et al. .................... 331/8
6,404,240 B1 * 6/2002 Hakkal et al. ................ 327/12
6,437,616 B1 * 8/2002 Antone et al. .............. 327/158

* cited by examiner

Primary Examiner—Kenneth B. Wells
Assistant Examiner—Cassandra Cox
(74) Attorney, Agent, or Firm—Alan K. Stewart; W. James Brady, III; Frederick J. Telecky, Jr.

(57) ABSTRACT

A PLL lock generator using one circuit (lock detection block) to indicate whether an output clock signal is locked to an input reference signal, and another circuit to determine whether the signals are out-of-lock. A lock generation blocks examines several indications of lock detection before generating a lock signal. Short term fluctuations (such as jitter) in lock and out-of-lock indications may be ignored. An embodiment of lock detection block contains a first flip-flop latching an up signal and clocked by a down signal, and a second flip-flop latching the down signal and clocked by an up signal. The up and down signals may be generated by a phase frequency detector. An examination circuit examines the output of lock detection block to generate the lock indications.

9 Claims, 6 Drawing Sheets

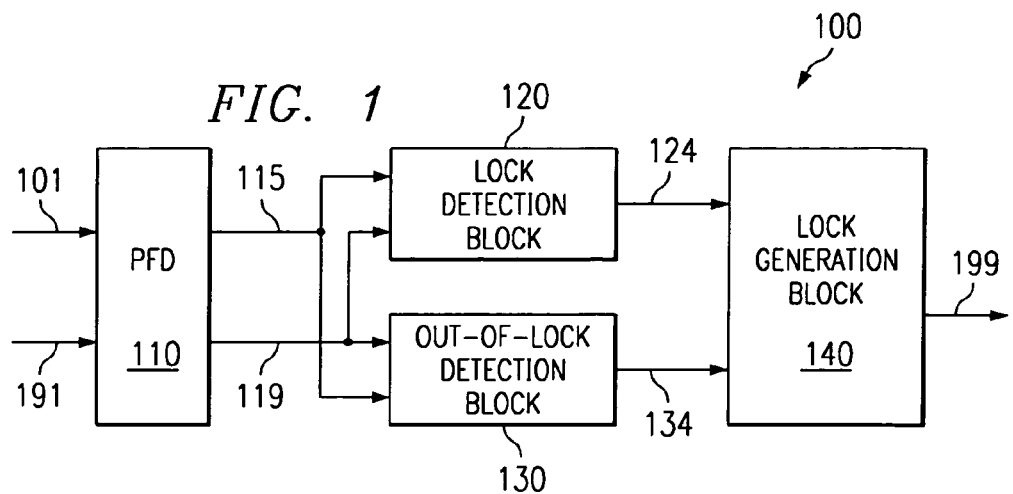
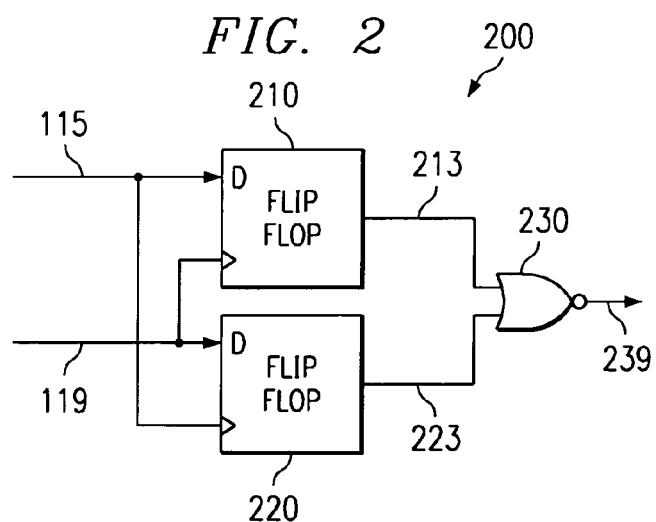
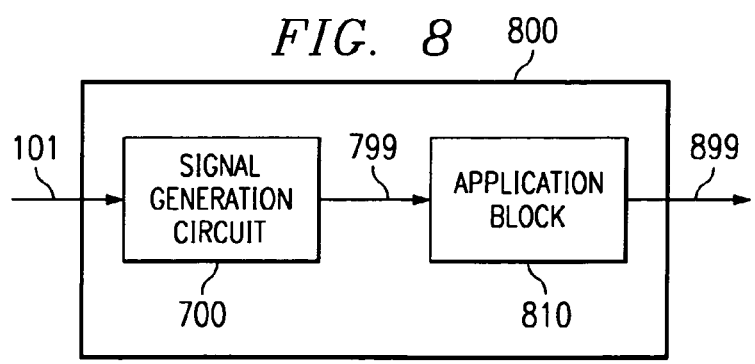

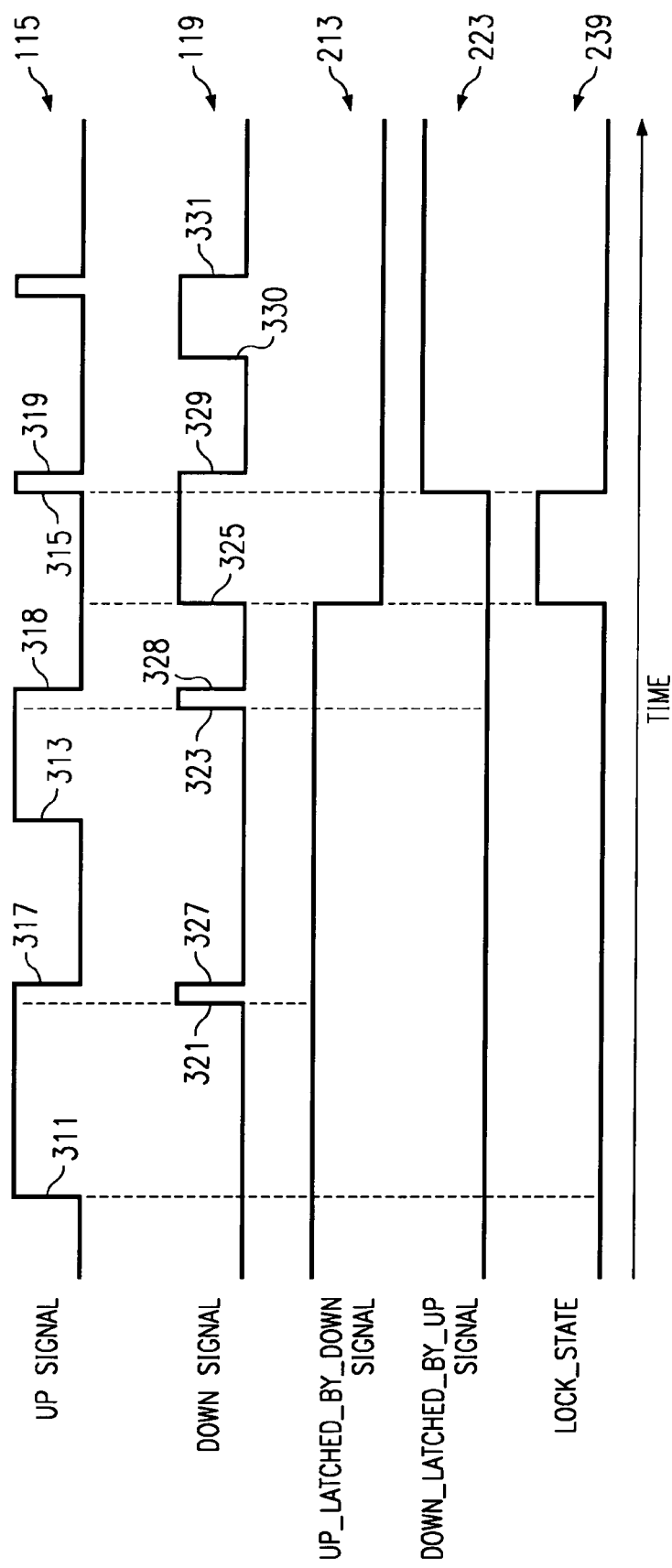

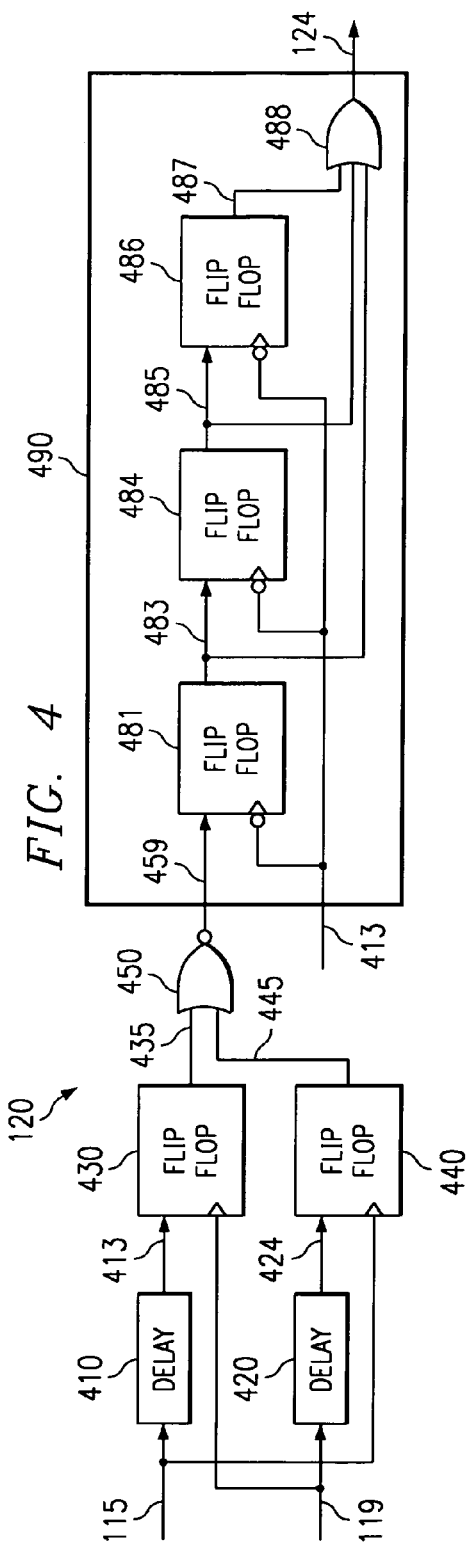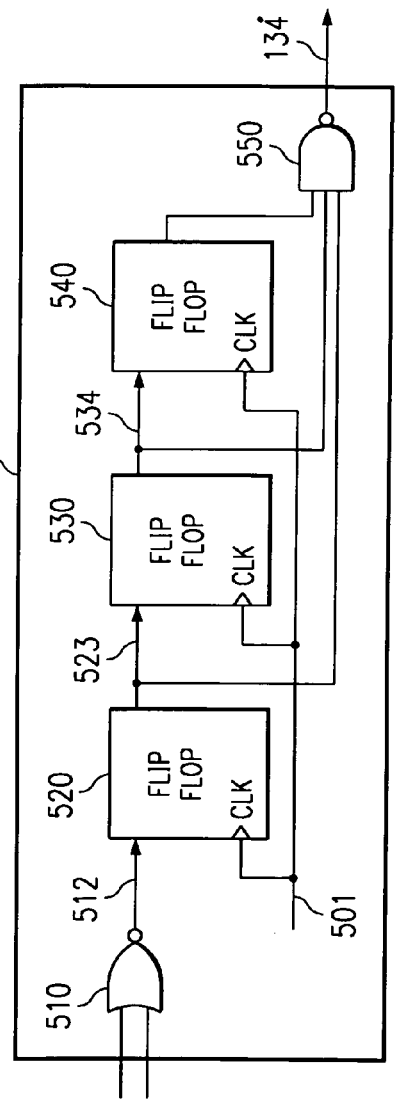

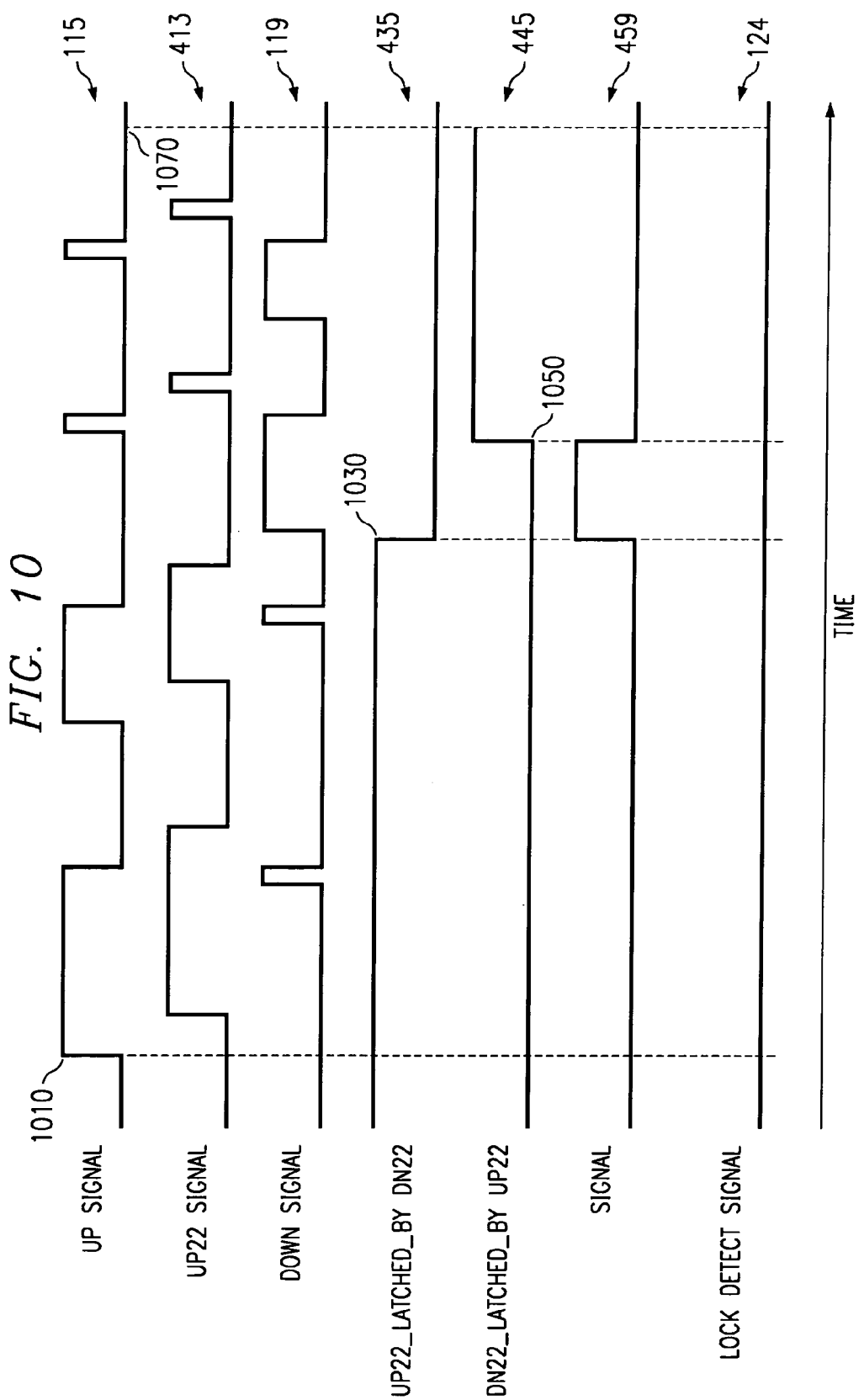

GENERATING A LOCK SIGNAL INDICATING WHETHER AN OUTPUT CLOCK SIGNAL GENERATED BY A PLL IS IN LOCK WITH AN INPUT REFERENCE SIGNAL

BACKGROUND OF THE INVENTION

1. Field of the Invention

The present invention relates to phase locked loop (PLL) circuits, and more specifically to a method and apparatus for generating a lock signal indicating whether an output clock signal generated by a PLL is locked to an input reference signal.

2. Related Art

Phase locked loop (PLL) circuits are often used to generate output clock signals synchronous with an input reference signal. Typically, a desired frequency (often in the form of a multiple of the frequency of the input reference signal) of an output clock signal is specified, and a PLL generates the output clock signal with the specified frequency.

An output clock signal (or PLL) is generally said to be locked when an output clock signal has acquired a specified frequency and tracks the input reference signal. A lock situation is often detected by dividing the output clock signal with a multiple (of the input reference signal) used to specify the desired frequency, and comparing the phase and frequency of the resulting divided signal with the input reference signal. A lock would be found to exist if a match is detected between the two compared signals in terms of both phase and frequency for a sufficiently long time.

Lock signal generation circuits are often employed in (or associated with) PLLs. A typical lock signal generation circuit provides a signal indicating whether the PLL is locked, and the signal is often used to determine whether to provide the output clock signal to external circuits (which are typically driven by the output clock signal).

Lock signal generation circuits generally need to be designed meeting several requirements. One typical requirement is that a lock be indicated when the PLL is accurately locked. Another typical requirement is that the lock (or unlock) indications not be susceptible to short term disturbances such as jitter in the input reference signal.

Therefore, what is generally needed is a lock signal generation method and apparatus which meets such requirements.

BRIEF DESCRIPTION OF THE DRAWINGS

The present invention will be described with reference to the accompanying drawings, wherein:

FIG. 1 is a block diagram illustrating the details of an embodiment of a lock signal generation circuit implemented in accordance with the present invention;

FIG. 2 is a block diagram illustrating the details of an embodiment of a PLL lock detector;

FIG. 3 is a timing diagram of various signals illustrating the details of operation of an embodiment of the PLL lock detector;

FIG. 4 is a block diagram illustrating the details of an embodiment of lock detection block implemented in accordance with the present invention;

FIG. 5 is a block diagram illustrating the details of an embodiment of out-of-lock detection block implemented in accordance with the present invention;

FIG. 8 is a block diagram illustrating an example environment in which the present invention can be implemented;

FIG. 10 is a timing diagram illustrating how lock detect signals is not falsely asserted according to an aspect of the present invention.

DETAILED DESCRIPTION OF THE PREFERRED EMBODIMENTS

Figure 6:
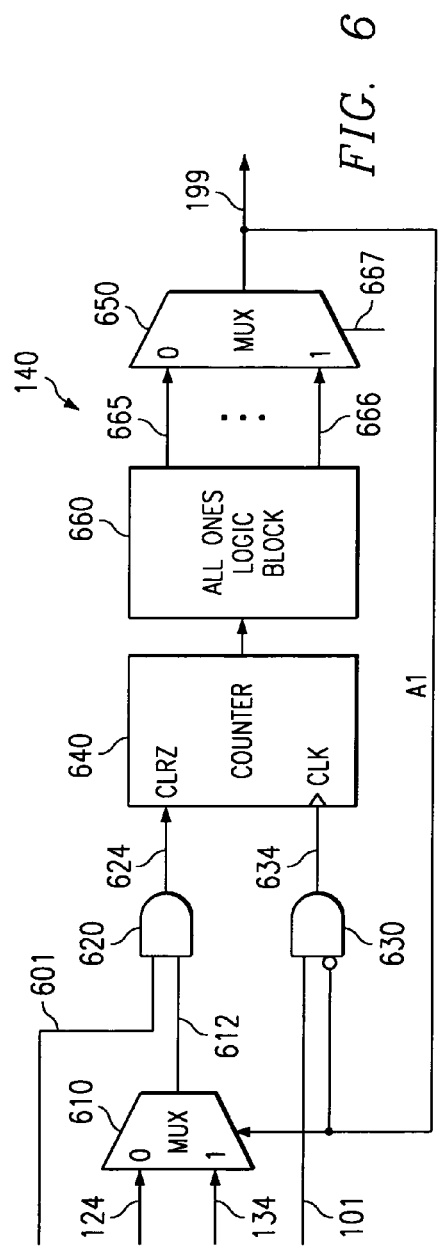
FIG. 6 is a block diagram illustrating the details of an embodiment of lock generation block implemented in accordance with the present invention.

1. Overview and Discussion of the Invention

According to an aspect of the present invention, a lock detector circuit examines UP and DOWN signals (indicating whether the frequency of an output clock signal has to be increased or reduced) to determine whether an output clock signal is locked to a reference input signal. A first flip-flop may be used to sample the UP signal using the DOWN signal as a clock and a second flip-flop may be used to sample the DOWN signal using the UP signal as a clock. A lock may be determined to be present if the outputs of both the flip-flops are at a low logical level (0). The outputs of the flip-flops may be examined for several successive clock cycles before asserting a lock signal.

According to another aspect of the present invention, one circuit is designed to determine whether an output clock signal is locked and another separate circuit is designed to determine if the output clock signal is out-of-lock. For example, the circuit noted in the previous paragraph may be used to generate the lock signal, and another circuit may independently determine whether the output clock signal is out-of-lock.

Several aspects of the invention are described below with reference to example environments for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. PLL Lock Generator

FIG. 1 is a block diagram illustrating the details of an embodiment of PLL lock generator 100 implemented in accordance the present invention. PLL lock generator 100 is shown containing phase frequency determination block (PFD) 110, lock detection block 120, out-of-lock detection block 130 and lock generation block 140. Each component is described in further detail below.

PFD 110 compares the phase of an input reference signal received on line 101 and a divided clock signal (generated by dividing an output clock signal, as described in sections below) received on line 191 typically in every clock cycle of the reference clock signal, and generates a corresponding UP signal on line 115 and a DOWN signal on line 119. In an embodiment, UP signal 115 indicates that the frequency of the output clock signal generated by the PLL (containing PLL lock generator 100) needs to be increased and DOWN signal 119 indicates that the frequency of the output clock signal generated by the PLL needs to be reduced to achieve a lock with the reference clock signal. PFD 110 may be implemented in a known way.

Lock detection block 120 examines UP signal 115 and DOWN signal 119 to determine whether the output clock signal is locked to the reference clock signal for a short duration (e.g., every reference clock cycle). Out-of-lock detection block 130 determines independently (i.e., not a complement of lock detection signal) whether the output clock signal is unlocked for a short duration. Lines 124 and 134 respectively indicate whether a lock and out-of-lock have been determined in the short term.

Lock generation block 140 asserts or de-asserts lock signal 199 based on the signal values received on lines 124 and 134. Due to the information of lock and out-of-lock determined independently (and using different logic), lock signal 199 may be asserted and de-asserted using flexible approaches as desired by a designer. Embodiment(s) of lock detection block 120, out-of-lock detection block 130 and lock generation block 140 are described below. It is helpful to understand the basic approach of determining a lock situation in a clock cycle within lock detection block 120, and accordingly a PLL lock detector is described first.

3. PLL Lock Detector

FIG. 2 is a block diagram illustrating the details of an embodiment of PLL lock detector 200. PLL lock detector 200 is shown containing flip-flops 210 and 220, and NOR gate 230. Each component is described in further detail below.

Flip-flop 210 generates UP_latched_by_DOWN signal 213 which corresponds to UP signal 115 latched at a time point determined by a positive transition on DOWN signal 119. Thus, flip-flop 210 is shown receiving UP signal 115 and is clocked by the positive edge of DOWN signal 119. Similarly, flip-flop 220 is shown receiving DOWN signal 119 and clocked by UP signal 115, and thus generates DOWN_latched_by_UP signal 223.

Flip-flops (delay flip-flops) 210 and 220 represent examples of sampling circuits, which sample an input signal at a time specified by a clock (reference) signal. The input signal is generally captured at a time specified by the clock(reference) signal. It should be understood that sampling circuits can be implemented using other components such as latches, J-K flip-flops etc.

NOR gate 230 generates lock_state signal 239 depending on UP_latched_by_DOWN signal 213 and DOWN_latched_by_UP signal 223. When both UP_latched_by_DOWN signal 213 and DOWN_latched_by_UP signal 223 are at logic low state, NOR gate 230 generates a logic high on lock_state signal 239 indicating that the output clock signal is locked in the examined clock cycle (typically of input reference signal).

It should be appreciated that NOR gate 230 is an example of an examining circuit which examines the outputs of flip-flops 210 and 220 to determine whether there is a short term lock. The examining circuit may contain additional circuitry as described in below sections with examples.

It may be further appreciated that both the inputs of NOR gate 230 would be at a logic low when the output clock signal is locked to the reference signal as both the UP signal 115 and DOWN signal 119 would ideally have no pulses. However, in reality, durations in which pulses are of fairly short width, may need to be considered as locked situations. Accordingly, additional circuitry which causes such as indication to be attained is described below with reference to FIG. 4.

Even more circuitry may need to be added to PLL lock generator 100 of FIG. 1, particularly to address any problems encountered (recognized) during different operating situations. Some example problems are described below first, and then the manner in which the problems can be addressed is described.

4. Example Problems

One problem encountered is that a false lock determination may be generated on lock state signal 239 when a PLL over-corrects in one direction and thus has to correct in the other direction. The problem is illustrated with reference to FIG. 3. FIG. 3 is a timing diagram containing UP signal 115, DOWN signal 119, UP_latched_by_DOWN signal 213, DOWN_latched_by_UP signal 223 and lock_state signal 239.

UP signal 115 is shown at a logical high level between time points 311 and 317,313 and 318, and 315 and 319 and at low level between time points 317 and 313, and 318 and 315. Similarly, DOWN signal 119 shown at a logical high level between time points 321 and 327, 323 and 328, and 325 and 329 and at low level between time points 320 ans 321, 327 and 313, and 328 and 325.

The logical highs on UP signal 115 between time points 311 and 318 cause the output clock signal to be over-corrected (i.e., frequency increased more than necessary for synchronization with divided clock signal). The following logical highs on DOWN signal 119 between time points 325 and 331 cause the frequency to be adjusted in the other direction. During such adjustment, a false lock_state signal is asserted as described below with reference to each of the signals generated by PLL lock detector 200.

UP_latched_by_DOWN signal 213 is shown at a high logical level from time point 321 until time point 323 since UP signal 115 is at a high logic level when DOWN signal generates a positive transition at time point 321. UP_latched_by_DOWN signal 213 continues at a high logical level since UP signal 115 is at a high logical level when DOWN signal generates a positive transition at time point 323. At time point 325, UP_latched_by_DOWN signal 213 transitions to a low logical level as UP signal 115 is at a logical low level when DOWN signal 119 generated a positive transition at time point 325. UP_latched_by_DOWN signal 213 is shown continuing at low logical level from time point 325.

DOWN_latched_by_UP signal 223 is shown at a low logical level from time point 311 until time point 315 since DOWN signal 119 is at a low logic level when UP signal generates a positive transition at time point 321. DOWN_latched_by_UP signal 223 continues at a low logical level as DOWN signal 119 is at a low logical level when UP signal 115 generated a positive transition at time point 313. At time point 315, DOWN_latched_by_UP signal 223 transitions to a high logical level as DOWN signal 119 is at a logical high level when UP signal 115 generated a positive transition at time point 315. DOWN_latched_by_UP signal 223 is shown continuing at high logical level from time point 315.

From the above, it may be observed that the frequency of the output clock signal is over-corrected due to UP signal 115 between time points 311 and 318. The frequency of the output clock signal is then corrected in the other direction due to DOWN signal 119 between time points 325 and 331. As described below with reference to lock_state signal 239, a false lock indication is generated (after time point 325) when the correction is being performed in the other direction.

Between time points 325 and 315, lock_state signal 239 is shown at a high logic state, indicating a locked status. However, examination of DOWN signal 119 in the corresponding duration clearly indicates that the output clock is out-of-lock. As such, the status indicated by lock generator 200 is a false lock indication. However, lock_state signal 239 is correctly shown at low status (out-of-locked) between time points 311 and 325. The manner in which the false lock indication may be corrected is described below with reference to an example embodiment of lock detection block 120 in FIG. 4.

Another problem lock detection block 120 may need to address is the presence of jitter (errors of short duration) in the reference clock signal. In many instances, it may be desirable to ignore jitter, and the manner in which jitter is ignored in lock and out-of-lock detection is described in below sections. In addition, lock detection block 120 may need to ignore short term jitters as noted above. An example lock detection block 120, which addresses such requirements is described below.

5. Lock Detection Block

FIG. 4 is a block diagram illustrating the details of an embodiment of lock detection block 120. Lock detection block 120 is shown containing delay blocks 410 and 420, flip-flops 430 and 440, NOR gate 450, and jitter filter 490. Each component is described in further detail below.

Delay blocks 410 and 420 delay UP signal 115 and DOWN signal 119 respectively by a desired amount of time to generate corresponding UPZZ signal 413 and DNZZ signal 424. The desired amount is generally determined by the duration of potential mismatch of the UP and DOWN signals during locked state. That is, even if one of the signals is asserted for a longer time of duration less than the desired amount, delay blocks 410 and 420 cause a determination of lock to be generated.

In one embodiment, the negative transitions of the UP and DOWN signals are designed to coincide and the desired amount equals 800 Pico-seconds. The 800 Pico-seconds is selected to account for a maximum expected mis-match of 550 Pico-seconds (in a lock state), allowing for an extra tolerance of 250 Pico-seconds. Placing the delay blocks in the path of the data inputs of flip-flops increases the set up time of the flip-flops by the desired amount, as will be apparent to one skilled in the relevant arts. Alternatively, the delay blocks may be placed in the path of the clock signal inputs of the flip-flops also. Delay blocks 410 and 420 may be implemented in a known way.

Flip-flops 430 and 440 receive UPZZ signal 413 and DNZZ signal 424 respectively and generate signals 435 and 445. Flip-flops 430 and 440, and NOR gate 450 respectively operate in the same manner (but with UPZZ and DNZZ as inputs) as flip-flops 210 and 220, and NOR gate 230 of PLL lock detector 200 of FIG. 2, and the description is not repeated again for conciseness.

As noted above, NOR gate 450 forms a part of an examining circuits. The examining circuit is shown containing jitter filter 490 to ignore jitter. In addition, jitter filter is designed to avoid generating false lock signals (described above with reference to FIG. 3) as described in below sections with reference to FIG. 10.

Jitter filter 490 ignores any jitter present in the output (459) of NOR gate 450. In an embodiment, jitter filter 490 contains flip-flops 481, 484 and 486 cascaded in series and OR gate 488. The first flip-flop 481 receives the output of NOR gate 450 as input. OR gate 488 receives the outputs of flip-flops 481, 484 and 486 as inputs. The three flip-flops are clocked by the negative edge of UPZZ signal 413.

The output of OR gate 488 is provided as lock detect signal 124. Lock detect signal 124 would not respond to short term jitter (of less than 3 clock cycles) as lock detect signal 124 is asserted if a lock has been detected by NOR gate 450 in any one of the three prior clock cycles. In other words, lock detection block 120 would ignore short term jitter less than three clock cycles. Thus, jitter may be filtered by jitter filter 490.

In addition, as the three flip-flops 481, 484 and 486 are clocked by the negative edge of UPZZ signal, the false lock signal (lock_state 239)described in FIG. 3 may also be avoided as described below in further detail in sections below with reference to FIG. 10. It should be understood that the DNZZ signal may be used instead to achieve a similar result.

Thus, lock detect signal 124 may provide a reliable and jitter free indication of when a lock has been detected based on one examination. As noted above, lock detect signal 124 is used as one input is generating lock signal 199, and out-of-lock detect signal 134 is used as another input. The manner in which out-of-lock detect signal 134 may be generated is described below with an example embodiment of out-of-lock detection block 130.

6. Out-of-Lock Detection Block

FIG. 5 is a block diagram illustrating the details of an embodiment of out-of-lock detection block 130. Out-of-lock detection block 130 is shown containing XOR gate 510, flip-flops 520, 530 and 540 and NAND gate 550. The components are described in further detail below.

XOR gate 510 generates a logic low (on line 512) in a locked state as the two inputs UPZZ 413 and DNZZ 424 would be equal in duration (ignoring small mismatches). Once there is a disturbance, one of the two inputs will contain pulses of longer duration, causing the output 512 to go to logic high. The remaining components operate to remove jitter from the indications provided on line 512.

Flip-flops 520, 530 and 540 are cascaded serially, with the first flip-flop 510 receiving the output of XOR gate 510 as input. The outputs of the three flip-flops are provided as an input to NAND gate 550. As a result, a jitter free out-of-lock signal detect signal 134 is provided (a logical value of 0) only if an out-of-lock situation is detected in three successive clock cycles. Otherwise, a value of 1 is provided on line 134.

By using NAND gate 550, it can be ensured that a de-assert signal (logic value of 0) is generated only when XOR gate 510 generates a logic high value for three (equal to the number of cascaded flip-flops) consecutive clock cycles of output clock signal 501. Thus, de-assert signal is not generated for jitters (one or two out-of-lock indications in three cycles) that may occur on UP signal 115 and DOWN signal 119.

The three flip-flops are clocked by positive edge of output clock signal 501 generated by a PLL. As the output clock signal typically has a much higher frequency than an input reference signal, examination for out-of-lock situation is performed several times within each reference clock cycle.

The lock detect signal 124 and out-of-lock detect signal 134 are provided to lock generation block 140 which generates a lock signal. The manner in which lock generation block 140 may be implemented is described below with reference to an example embodiment.

7. Lock Generation Block

FIG. 6 is a block diagram illustrating the details of an embodiment of lock generation block 140. Lock generation block 140 is shown containing multiplexor 610 and 650, AND gates 620 and 630, and counter 640. Each component is described in further detail below.

Multiplexor 610 selects either lock detect signal received on line 124 or out-of-lock signal received on line 134 depending on the state of lock signal generated on line 199. Initially, lock signal 199 is at a logic low (during acquisition phase), and thus lock detect signal is propagated on line 612. When lock signal 199 is asserted (at logic level high) then de-assert signal is propagated on line 612.

AND gate 620 performs a logical AND operation on reset signal received on line 601 and output of multiplexor 610 on line 612 to generate an output on path 624. Path 624 is connected to clear (logic low) input of counter 640. The effect of the operation of AND gate 620 is described below with reference to counter 640.

AND gate 630 propagates input reference signal on line 634 to CLK input of counter 640 as long as lock signal 199 is low (that is, the PLL is out-of-locked). Once lock signal goes high, AND gate 630 propagates a logic low on line 634, thus causing counter 640 to stop counting. The effect of the operation of AND gate 630 is described below with reference to counter 640.

All-ones logic block 660 generates a 1 on line 665 if the least significant 5 bits (lower count) are at 1. Similarly, a 1 is generated on line 666 if all the 9 bits in counter 640 are at 1. Otherwise a 0 is generated on the corresponding line. All-ones logic block 660 may be implemented as a combinational circuit in a known way.

Multiplexor 650 selects one of the two inputs 665 or 666 under control of select line 667. Select line causes value on line 665 to be selected if operating at lower frequency and value on line 666 to be selected if operating at higher frequency. In general, when counter 640 contains all ones, the lock signal is asserted and deasserted otherwise.

Counter 640 counts the number of pulses received on CLK input until an all ones (maximum count) value is reached, and is reset to zero by a low value on clear input. As described below, lock signal 199 is asserted when counter has all ones value. When the lock signal is asserted, the counter stops counting due to the operation of AND gate 630, and a lock state is maintained until a zero output is generated by AND gate 620.

In operation, when a PLL is initialized (e.g., powered up), a zero may be generated on RESETZ signal causing counter 640 to be reset to zero. As a result, lock signal 199 is de-asserted and multiplexor 610 selects lock detect signal 124. During frequency/phase acquisition, lock detect signal 124 continues to generate a 0, causing counter 640 to remain reset at 0.

When a transition to a locked status occurs, lock detect signal 124 generates a 1 preventing counter 640 from being cleared. Counter 640 continues to count until multiplexor 650 generates a locked signal (1). When the lock signal (1 on line 199) is generated, counter 640 stops counting due to a 0 value generated by AND gate 630. During the locked status, the value on out-of-lock detect signal 134 is selected by multiplexor 610.

When a transition to out-of-lock status occurs, out-of-lock detect signal 134 generates a 0 causing counter 640 to be cleared. As a result, line 199 generates a 0 (out-of-locked) value. Then, the values provided on out-of-lock detect signal 134 are selected and the signal generation continues as described above.

From the above, it may be appreciated that assertion of lock signal 199 is based on the outputs generated by lock detection block 120 and de-assertion of lock signal is based on the output generated by out-of-lock detection block 130.

Thus, lock generation block 140 may be implemented to assert a lock signal when the PLL is locked and de-assert the lock signal when PLL is unlocked. The description is continued with reference to a timing diagram illustrating the clock signals generated and used by lock detection block 120, out-of-lock detection block 130 and lock generation block 140.

8. Timing Diagram

Figure 9:
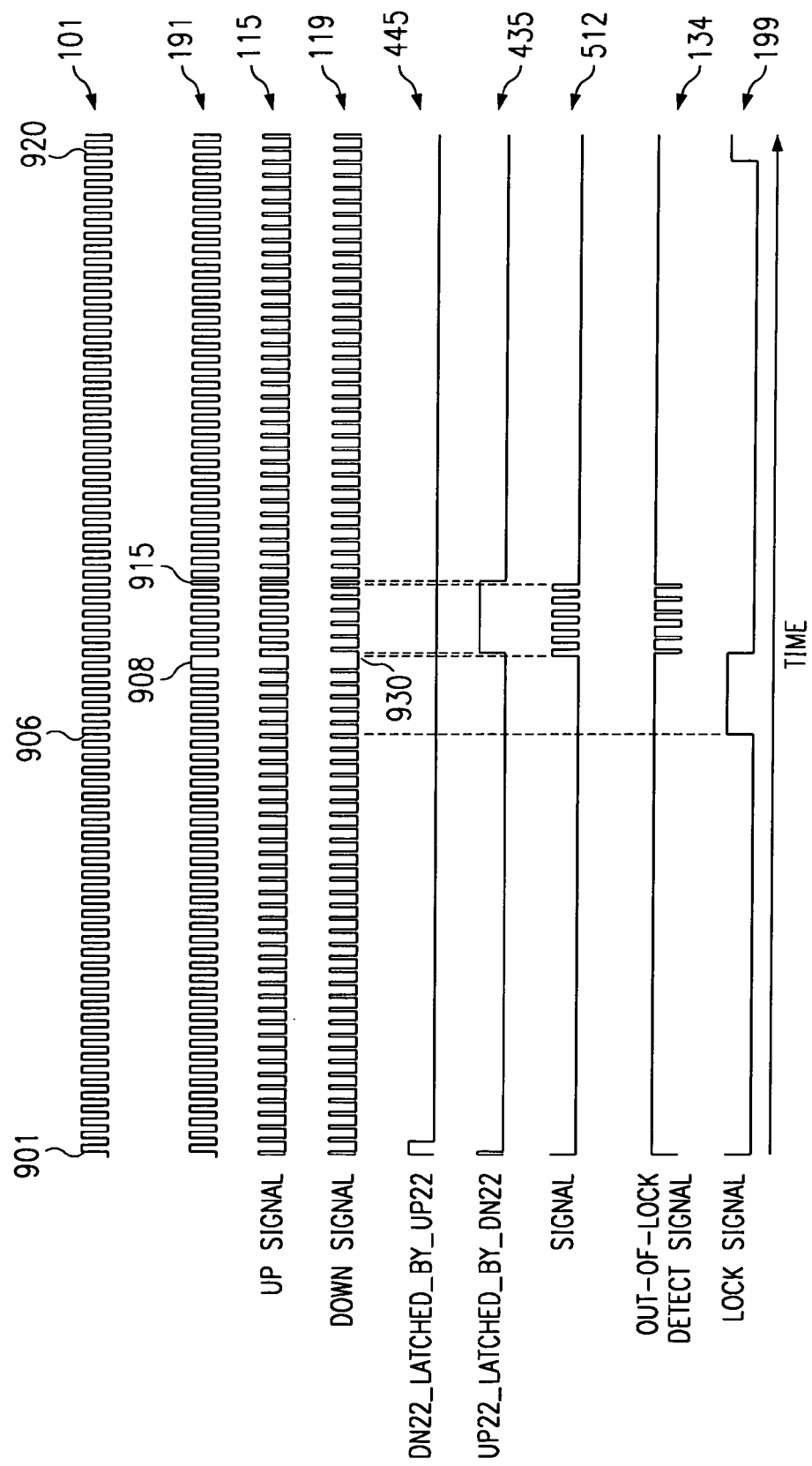
FIG. 9 is a timing diagram illustrating the various clock signals used and generated by lock detector.

FIG. 9 is a timing diagram illustrating the timing relationship between input reference signal 101, signal 191 (divided clock signal generated by dividing an output clock signal, as described in sections below), UP signal 115, DOWN signal 119, UPZZ_latched_by_DNZZ signal 435, DNZZ_latched_by_UP signal 445, signal 512 (output signal of XOR gate 510), out-of-lock detect signal 134 and lock signal 199. A disturbance is illustrated between points 908 and 916 on signal 191.

Between points 901 and 908, UP signal 115 and DOWN signal 119 are shown with short pulses indicating output clock signal 501 is synchronized to reference input signal 101. Therefore, signal 512 generated by XOR gate 510 is shown at a logic low level and thus out-of-lock detect signal 134 generated by NAND gate 550 is at a logic high level. Lock signal is shown low between points 901 and 906 as counter 640 performs a count operation for a specified number of clock cycles of input reference signal 101. At the end of the count operation (at point 906), lock signal 199 is asserted (goes high).

Between points 908 and 916, disturbance is shown on signal 191 causing pulses of longer duration on UP signal 115 from point 930 (which is shortly after point 908). However, short pulses continue to be generated on DOWN signal 119. As a result, XOR gate 510 generates pulses starting from point 930. NAND gate 550 also asserts out-of-lock detect signal 134 thus causing lock signal 199 to be de-asserted at point 930.

Between points 916 and 920, signal 191 is again synchronized with input reference signal 101 and is free of disturbances. Signal 512 is shown going low again between points 916 and 920 since both UP signal 115 and DOWN signal 119 contain short pulses. As a result, out-of-lock signal 134 is shown at a logic high level between points 916 and 920 as no disturbance is detected on signal 191. Lock signal 199 remains low between points 908 and 920 (even after out-of-lock signal 134 is de-asserted) as counter 640 performs count operation again for specified number clock cycles of input reference signal. At point 920 when counter 640 completes the count operation lock signal 199 is asserted again.

From the above, it may be appreciated that lock signal is accurately asserted to reflect whether the output clock signal is synchronized to the input reference clock signal. In addition, the false assertion of lock detect signal (noted with reference to FIG. 3 above) is also avoided by the implementation(s) of FIG. 4. The manner in which the false lock assertion is avoided is described below with reference to a timing diagram.

9. Avoidance of False Lock Assertion

FIG. 10 is a timing diagram illustrating the manner in which the false lock assertion (described above with reference to FIG. 3) may be avoided according to an aspect of the present invention. FIG. 10 is shown containing UP signal 115, UPZZ signal 413, DOWN signal 119, UPZZ_latched_by_DNZZ signal 435, DNZZ_latched_by_UPZZ signal 445, signal 459 (signal generated by NOR gate 450) and lock detect signal 124. The signals are described below in further detail.

UPZZ signal 413 is a delayed version of UP signal 115. Similarly, DOWN signal 119 may also be delayed and the delayed signal may be referred to as DNZZ signal 424 (not shown in Figure). UPZZ_latched_by_DNZZ signal 435 is shown at a logic high between points 1010 and 1030 ans is shown at a logic low between points 1030 and 1070. Similarly DNZZ_latched_by_UPZZ signal 445 is shown at a logic low between points 1010 and at a logic high level between points 1050 and 1070.

Between points 1050 and 1070, both UPZZ_latched_by_DNZZ signal 435 and DNZZ_latched_by_UPZZ signal 445 are at a logic low level for a short duration. As a result, NOR gate 450 generates a logic high on signal 459 which is a false assertion as UPZZ_latched_by_DNZZ signal 435 and DNZZ_latched_by_UPZZ signal 445 are low only for a short duration of time.

To overcome the problem of false assertion of lock detect signal, signal 459 is latched to the negative edge of UPZZ signal 413 (or DNZZ signal 424) by using jitter filter 490 as described in the earlier sections. Thus, if UPZZ_latched_by_DNZZ signal 435 and DNZZ_latched_by_UPZZ signal 445 are low for a short duration, lock detect signal 134 is not asserted as shown between points 1030 and 1050. Thus, the false lock assertion is avoided. The description is continued with reference to an example signal generation circuit in which PLL lock detector 100 may be implemented.

10. Signal Generation Circuit

Figure 7:
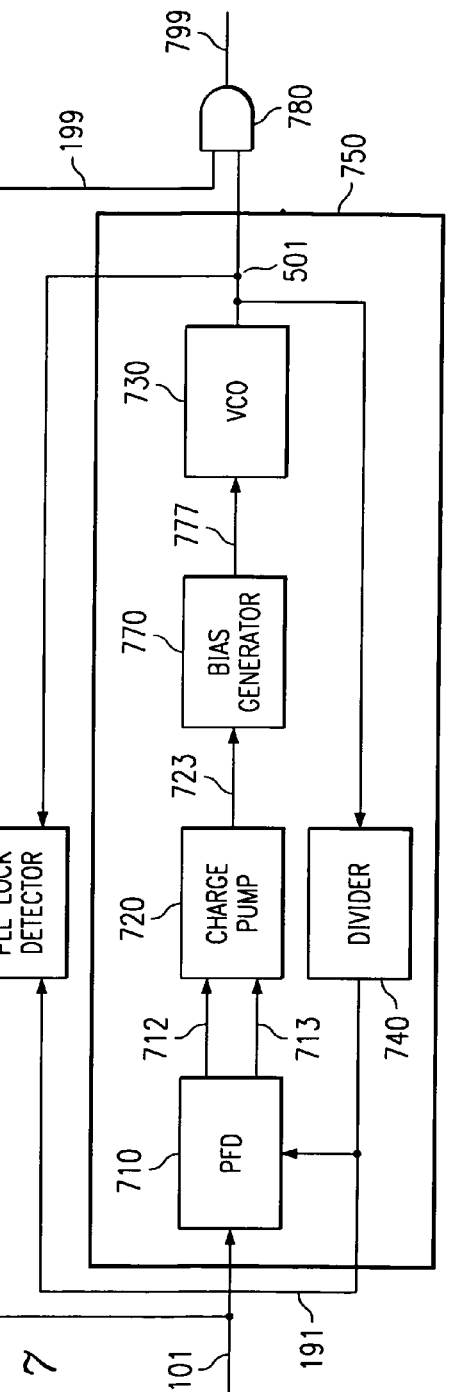
FIG. 7 is a block diagram illustrating the details of a signal generation circuit implemented in accordance with the present invention.

FIG. 7 is a block diagram illustrating the details of an embodiment of signal generation circuit 700 in accordance with the present invention. Signal generation circuit 700 is shown containing PLL 750, PLL lock generator 100 and AND gate 780. Each component is described in further detail below.

PLL 750 generates high frequency output clock signal on line 501 which is synchronous with low frequency input reference signal 101. PLL lock generator 100 generates lock signal 199 having a value of 1 (locked) or 0 depending on whether the output clock signal is locked or not. AND gate 780 propagates output clock signal 501 generated by PLL 750 on line 799 only when PLL lock generator 100 asserts lock signal 199 (to 1). Thus, output clock signal 501 is propagated on line 799 only when lock signal 199 is asserted.

In an embodiment, PLL 750 contains phase frequency determination block (PFD) 710, charge pump 720, voltage controlled oscillator (VCO) 730, bias generator 770, and divider 740. A simple PLL is described herein only for illustration. However, the present invention can be implemented in the context of several other types of PLLs as well. Each component of PLL 750 is described in further detail below.

PFD 710 operates similar to PFD 110, and generates UP signal 712 and DOWN signal 713. Signals 712 and 713 may be directly used by PLL lock generator 100 to generate lock signal. However, the resulting load on PFD 710 may lead to inaccurate generation of output clock signal. Accordingly, in one embodiment two separate PFDs are used.

Charge pump 720 is charged typically proportionate to the phase difference due to the assertion of UP signal 712 and DOWN signal 713. Charge pump 720 may then generate proper biasing currents by sourcing current from Vdd (not shown) or sinking current to Vcc (not shown). Depending on the bias current, bias voltage is generated by bias generator 770 to bias VCO 730. The bias voltage causes VCO 730 to change the frequency of the output clock signal.

Divider 740 divides the frequency of output clock signal on line 501 to a lower frequency (corresponding to the frequency of signal 101) and generates signal 191. Signal 541 is compared with input reference signal 101 by PFD 710 and the process may be continued as described above to generate the output clock signal. Divider 740, PFD 710, charge pump 720, VCO 730 and bias generator 770 may be implemented in a known way.

Thus, signal generation circuit 700 may be used to generate output clock signals of a desired frequency which may in turn be used to drive other external circuits. The description is continued with reference to an example environment in which signal generation circuit 700 may be implemented.

11. Example Environment

FIG. 8 is a block diagram illustrating an example environment in which the present invention can be implemented. There is shown system 800 containing signal generation circuit 700 and application block 810. Each component is described in further detail below.

Broadly, signal generation circuit 700 generates signals on line 799 which may be used to drive application block 160. The signals generated by signal generation circuit 700 may also be used to drive other application blocks (not shown in FIG. 8) as well. Signal generation circuit 700 may generate signals on line 799 only when a PLL (implemented internally) is locked. If the PLL is unlocked, no signal is generated on line 799.

Application block 140 may refer to any component which uses signals generated on 146 for operation. Application block may receive signals on line 499 only when PLL implemented within signal generation circuit 700 is locked. If the PLL is unlocked, application block 140 becomes non operational since no signal is received on line 799.

12. CONCLUSION

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A lock detector block for detecting whether an output clock signal is locked to an input reference signal, said lock detector block comprising:
   a first sampling circuit receiving an up signal as an input and being clocked by a down signal, wherein said up signal indicates that the frequency of said output clock signal is to be increased and said down signal indicates that the frequency of said output clock signal is to be reduced to lock said output clock signal to said input reference clock signal, said first sampling circuit generating a first output indicating whether said output clock signal is out-of-lock;
   a second sampling circuit receiving said down signal as an input and being clocked by said up signal, said second sampling circuit generating a second output indicating whether said output clock signal is out-of-lock;
   an examining circuit receiving said first output and said second output, and generating a signal indicating that said output clock signal is locked to said input reference signal if both said first output and said second output indicate that said output clock signal is not out-of-lock; and wherein said examining circuit comprises a NOR gate, said first sampling circuit comprises a first flip-flop and said second sampling circuit comprises a second flip-flop.

2. The lock detector block of claim 1, further comprising:
a first delay element placed before either a data input or a clock input of said first flip-flop; and
a second delay element placed before either a data input or a clock input of said second flip-flop.

3. The lock detector block of claim 2, further comprises:
a plurality of flip-flops cascaded in series;
a first one of said plurality of flip-flops receiving said signal generated by said examining circuit as input, and wherein said plurality of flip-flops are clocked by an output of one of said first delay element and said second delay element; and
an OR gate generating an output by performing a logical OR operation on the outputs of said plurality of flip-flops cascaded in series,
wherein said output of said OR gate represents a jitter free indication of whether said output clock signal is locked to said input reference signal.

4. The lock detector block of claim 3, wherein said plurality of flip-flops cascaded in series are clocked by a delayed signal generated by either said first delay element or said second delay element.

5. The lock detector block of claim 4, wherein said up signal and said down signal are generated by a phase frequency detector based on a divided clock signal and said input reference signal, wherein said divided clock signal is generated by dividing said output clock signal.

6. A system comprising:
an application block driven by an output clock signal; and
a signal generation circuit generating said output clock signal synchronized with an input reference signal, said signal generation block comprises a lock detector block for detecting whether an output clock signal is locked to an input, reference signal, said lock detector block comprising:
a first sampling circuit receiving an up signal as an input and being clocked by a down signal, wherein said up signal indicates that the frequency of said output clock signal is to be increased and said down signal indicates that the frequency of the said output clock signal is to be reduced to lock said output clock signal to said input reference clock signal, said first sampling circuit generating a first output indicating whether said output clock signal is out-of-lock;
a second sampling circuit receiving said down signal as an input and being clocked by said up signal, said second sampling circuit generating a second output indicating whether said output clock signal is out-of-lock;
an examining circuit receiving said first output and said second output, and generating a signal indicating that said output clock signal is locked to said input reference signal if both said first output and said second output indicate that said output clock signal is not out-of-lock; and
wherein said examining circuit comprises a NOR gate, said first sampling circuit comprises a first flip-flop and said second sampling circuit comprises a second flip-flop.

7. The system of claim 6, wherein said signal generation circuit further comprising:
a first delay element placed before either a data input or a clock input of said first flip-flop; and
a second delay element placed before either a data input or a clock input of said second flip-flop.

8. The system of claim 7, further comprises:
a plurality of flip-flops cascaded in series;
a first one of said plurality of flip-flops receiving said signal generated by said examining circuit as input, and wherein said plurality of flip-flops are clocked by an output of one of said first delay element and said second delay element; and
an OR gate generating an output by performing a logical OR operation on the outputs of said plurality of flip-flops cascaded in series,
wherein said output of said OR gate represents a jitter free indication of whether said output clock signal is locked to said input reference signal.

9. The lock detector block of claim 8, wherein said plurality of flip-flops cascaded in series are clocked by a delayed signal generated by either said first delay element or said second delay element.

\* \* \* \* \*